United States Patent [19]

Nagumo et al.

[11] Patent Number: 4,489,287
[45] Date of Patent: Dec. 18, 1984

[54] PHASE SYNCHRONIZING CIRCUIT FOR DIGITAL DATA REPRODUCTION

[75] Inventors: Masahide Nagumo, Kawasaki; Tadashi Kojima, Yokosuka, both of Japan

[73] Assignee: Tokyo Shibaura Denki Kabushiki Kaisha, Japan

[21] Appl. No.: 331,076

[22] Filed: Dec. 15, 1981

[30] Foreign Application Priority Data

Jan. 14, 1981 [JP] Japan .................................... 56-4334

[51] Int. Cl.³ ........................ H03L 7/22; H04N 5/95
[52] U.S. Cl. ..................................... 331/1 A; 331/20; 360/36.2; 360/37.1; 328/155
[58] Field of Search ................. 331/1 A, 20, 172, 173; 360/36.2, 37.1, 39, 51

[56] References Cited

U.S. PATENT DOCUMENTS

| | | | |
|---|---|---|---|
| 3,686,469 | 8/1972 | Clark et al. | 328/155 X |
| 3,778,723 | 12/1973 | Schaefer | 328/155 X |
| 3,887,941 | 6/1975 | Dann et al. | 360/36 |
| 3,900,890 | 8/1975 | Eibner | 360/73 |
| 3,992,719 | 11/1976 | Machida | 360/37.1 X |
| 4,015,288 | 3/1977 | Ebihara et al. | 360/36.2 X |
| 4,115,786 | 9/1978 | Frey et al. | 360/70 X |

FOREIGN PATENT DOCUMENTS 2033178 5/1980 United Kingdom .

OTHER PUBLICATIONS

Ratz, A. et al., "Automatic Tape Editing Equipment" IEEE Trans. on Space Electronics & Telemetry vol. T-Set 9, No. 2 (Jun. 63) pp. 51–60.

Klinger, R. "Frequenzaufbereitung für mobile und tragbare funkgeräte mit quarzsparenden Schaltungen" Nachrictentechnische Zeitschrift, vol. 31, No. 3 (Mar. 78), pp. 207–209.

Primary Examiner—Stanley D. Miller
Assistant Examiner—W. R. Paxman
Attorney, Agent, or Firm—Finnegan, Henderson, Farabow, Garrett & Dunner

[57] ABSTRACT

A phase sychronizing circuit for a device which reproduces digital data has a phase locked loop including a first phase comparison circuit, a voltage controlled oscillator (VCO) producing an output the frequency of which is controlled by the first phase comparison circuit, and a first frequency divider to divide the output frequency of the VCO. The phase synchronizing circuit further includes second frequency divider for dividing the output frequency of the VCO, a second phase comparison circuit for comparing the phase of a first clock signal from the first frequency divider, with that of a second clock signal from the second frequency divider and a circuit for controlling the frequency dividing ratio of the first frequency dividing circuit according to the phase difference between the first and second clock signals in such a way that the frequency dividing ratio becomes one of $1/N$, $1/(N+1)$ and $1/\{(N+(N+1))/2\}$ wherein N is a positive integer.

2 Claims, 10 Drawing Figures

FIG. 4A
$\overline{PQ2}=L$ ; $\overline{PH}=L$

- OUTPUT OF VCO 15 — fs
- OUTPUT OF SR1 — Q1
- OUTPUT OF SR2 — Q2
- OUTPUT OF SR3 — Q3
- OUTPUT OF SR4 — Q4
- OUTPUT OF JKFF — QC
- OUTPUT OF 16 — fA

FIG. 4B
$\overline{PQ2}=L$ ; $\overline{PH}=H$

- OUTPUT OF SR1 — Q1
- OUTPUT OF SR2 — Q2
- OUTPUT OF SR3 — Q3
- OUTPUT OF SR4 — Q4
- OUTPUT OF JKFF — QC
- OUTPUT OF 16 — fA

FIG. 6C

PHASE SYNCHRONIZING CIRCUIT FOR DIGITAL DATA REPRODUCTION

BACKGROUND OF THE INVENTION

The present invention relates to a circuit for synchronizing clock signals and can be applied where recording and reproducing sections are synchronized with each other when digital data in one recording medium are copied on to another recording medium in a device which is intended to record and reproduce digital data.

In conventional analog tape recorders, for example, changes in the amplitude of signals, such as audio signals, which represent analog data are reflected in changes in the strength of magnetic fields on a magnetic tape. The performance of the head, tape and other parts of such recorders influence the dynamic range, distortion factor, and other characteristics of the audio signals. In addition the performance of a tape transporting system influences the frequency characteristics of the audio signals like wow, fluttering phenomenon, and introduced noise, and the audio signals are modulated by, for example the fluctuation of tape speed. Therefore, analog recorded audio information is degraded in tone quality every time it is copied.

There has been developed a system which records audio signals as digital data and reproduces the recorded digital data. This system samples audio signals at a predetermined sampling frequency, quantizes the amplitude of sampled audio signals, and records the audio signals as digital data on the tape. If the logical level of information recorded on the tape can be precisely determined to be either "0" or "1" when records stored on the tape are reproduced, the original analog waveforms will be restored completely. In actual practice the recording medium on which digital data are recorded is sommetimes deformed after it is used many times. In addition, errors are sometimes caused on recorded contents. Accordingly, recorded contents must be sometimes copied on a new recording medium. The reproducing device which copies digital data has usually error correcting function, thus allowing error-corrected digital data to be copied on the new recording medium. Therefore, unlike the copying of analog data, even an audio signal of low frequency can be restored without being influenced by the speed fluctuation wow, flutter, etc., of reproducing system.

When copying digital data onto another recording medium, digital data are transferred between reproducing section and recording section. It is therefore necessary that the reproducing section is completely synchronized with the recording section. Namely, a clock signal employed in the reproducing section and a clock signal employed in the recording section must be phase sychronized.

SUMMARY OF THE INVENTION

The object of the present invention is to synchronize a first clock signal employed in the transmitting section of a recorder with a second clock signal employed in the receiving section of a recorder.

A phase synchronizing circuit according to the present invention is provided with a phase locked loop including a first phase comparison circuit, a voltate controlled oscillator (VCO) for receiving the output of the first phase comparison circuit to produce an oscillation output of a predetermined frequency, first frequency dividing means having at least a first frequency divider to divide the frequency of the oscillation output of the VCO, to produce a first clock signal second frequency dividing means for dividing the frequency of the oscillation output of the VCO to produce a second clock signal a second phase comparison circuit for receiving, as inputs, the first clock signal and the second clock signal to compare phases of the first and second clock signals; and frequency dividing ratio controlling means for controlling the first frequency divider and the second phase comparison circuit in such a way that the frequency dividing ratio of the first divider is changed to one of three stages of 1/N, 1/(N+1), and 1/{N+(N+1)/2}, where N is a positive integer, according to the phase difference between the first and second clock signals so as to synchronize the phases of the first and second clock signals.

DETAILED DESCRIPTION OF THE PREFERRED EMBODIMENT

Figure 1:
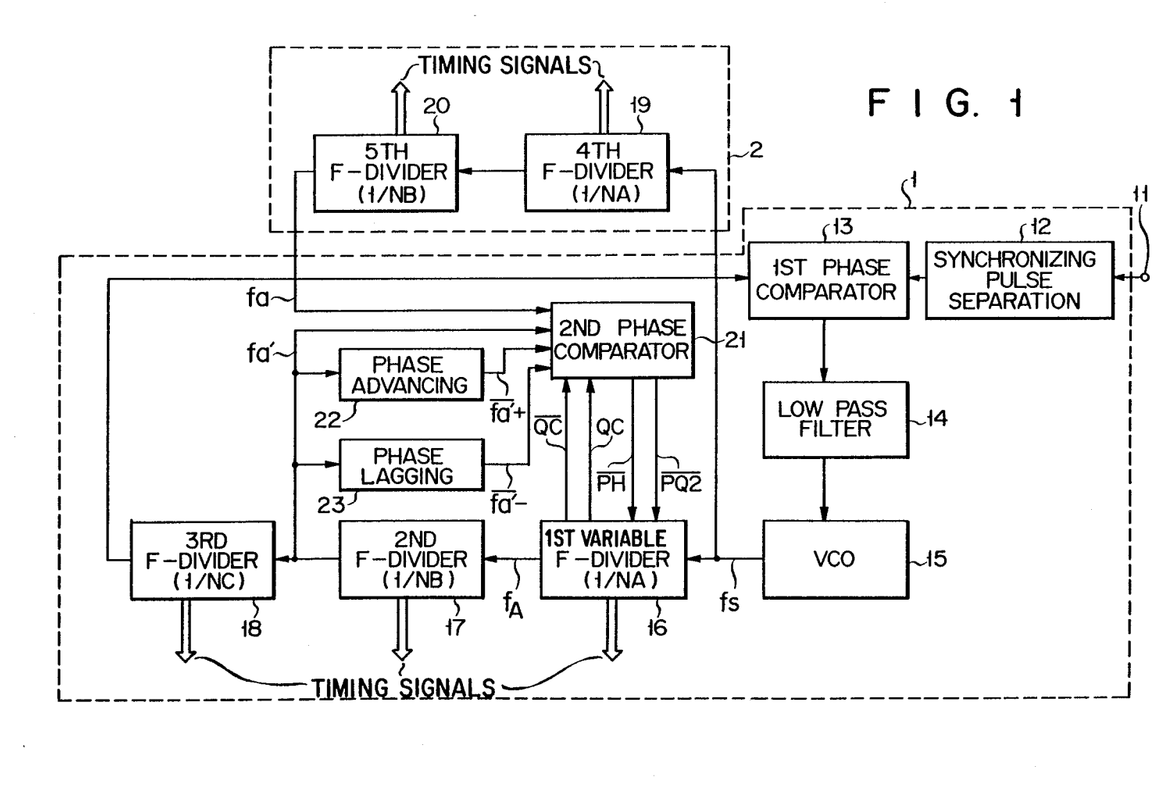
FIG. 1 is a block diagram showing an embodiment of the present invention.

In FIG. 1, numeral 1 represents a digital data reproducing section and numeral 2 represents a digital data recording section for recording the digital data reproduced. Data reproducing and recording circuits in digital data reproducing and recording sections 1 and 2, respectively are omitted and only phase synchronizing circuitry for clock pulses employed in the data reproducing and recording sections is shown in FIG. 1.

Numeral 11 denotes an input terminal to which reproduced signals from a digital data recording medium (not shown) are applied. Digitized audio and synchronizing signals, for example, are recorded on this recording medium. These synchronizing signals are separated from a reproduced TV format signal by a synchronizing signal separation circuit 12 and are then supplied to a first phase comparison circuit 13.

An output of the first phase comparison circuit 13 is fed back to the first phase comparison circuit 13 via a low pass filter 14, a voltage controlled oscillator (VCO) 15, a first frequency divider circuit 16 whose frequency dividing ratio is 1/NA, a second frequency divider circuit 17 whose frequency dividing ratio is 1/NB, and a third frequency divider circuit 18 whose frequency dividing ratio is 1/NC. The first phase comparison circuit 13, low pass filter 14, VCO 15, and first, second and third frequency divider circuits form a phase locked loop (PLL). The VCO circuit 15 outputs an oscillation output or oscillation signal $f_s$ having a constant frequency.

In the recording section 2, a fourth frequency divider circuit 19 divides the oscillation signal $f_s$ of VCO 15 by NA, and a fifth frequency divider circuit 20 divides the output frequency of the divider circuit 19 by NB to produce a clock signal $f_a$.

The output of the second frequency divider circuit 17 is a first clock signal $f_a$. Timing signals for the portions of the reproducing circuit whose detail is not shown are obtained through each of first, second and third frequency divider circuits and timing signals for the portions of the recording circuit which is not shown are obtained through each of fourth and fifth frequency divider circuits.

A second phase comparison circuit 21 is arranged to compare the phase of first clock signal $f_a'$ with that of second clock signal $f_a$. Input terminals of a phase advancing circuit 22 and a phase lagging circuit 23 are connected to the output terminal of second frequency divider circuit 17. The phase advancing circuit 22 produces an output signal $\overline{f_a'+}$ whose phase is advanced by a predetermined angle relative to the first clock signal $f_a'$. The phase lagging circuit 23 produces an output signal $\overline{f_a'-}$ whose phase is lagged by same angle relative to the first clock signal $f_a'$.

To the second phase comparison circuit 21 are supplied the first clock signal $f_a'$, second clock signal $f_a$, output $\overline{f_a'+}$ of phase advancing circuit 22, output $\overline{f_a'-}$ of phase lagging circuit 23, and signals QC and $\overline{QC}$ from first frequency divider circuit 16 which will be described later. Signals $\overline{PH}$ and $\overline{PQ_2}$ obtained as comparison results are supplied from the comparison circuit 21 to the first frequency divider circuit 16. Levels of outputs $\overline{PH}$ and $\overline{PQ_2}$ of second phase circuit 21 change according to the phase difference of first and second clock signals $f_a'$ and $f_a$, and the frequency dividing ratio of first divider circuit 16 changes according to the levels at $\overline{PH}$ and $\overline{PQ_2}$ allowing the phase of first clock signal to be synchronized with that of second clock signal. The first frequency divider circuit 16 and the second phase comparison circuit 21 will be now described in detail referring to FIG. 2.

Figure 2:
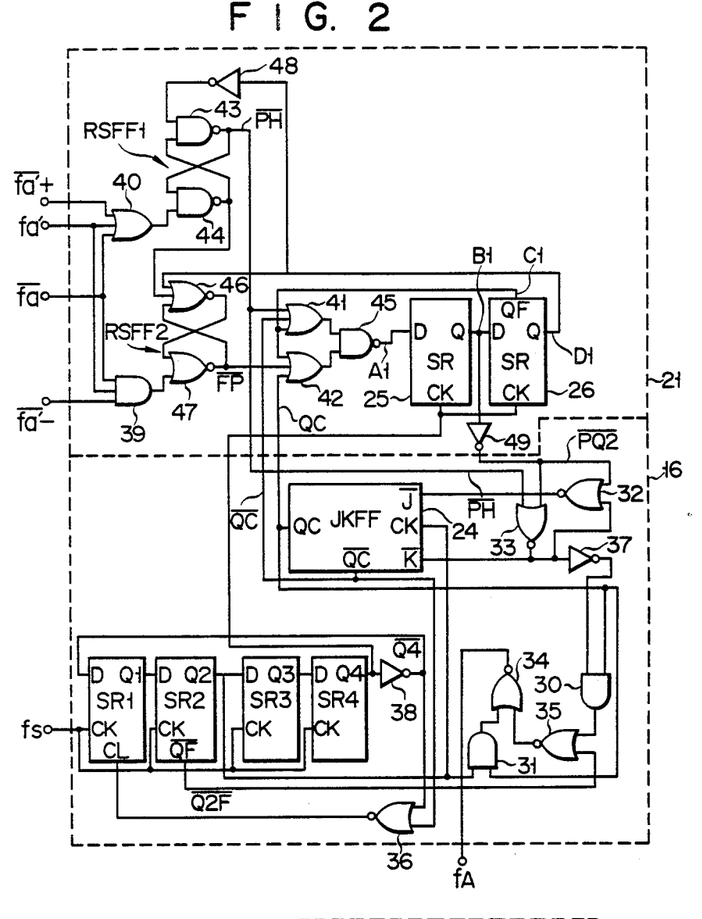
FIG. 2 is a circuit diagram of the first frequency divider and the second phase comparator shown in FIG. 1.
Figure 3:
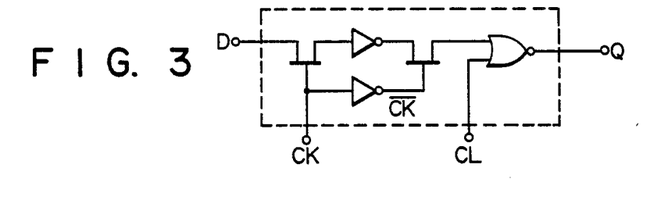
FIG. 3 shows the internal arrangement of a shift register SR1 shown in FIG. 2.

The oscillation signal $f_s$ of VCO 15 is supplied to CK terminals of first, second, third and fourth shift registers SR1, SR2, SR3 and SR4. The arrangement of each of shift registers SR1, SR3 and SR4 is shown in FIG. 3. A $\overline{QF}$ terminal in the shift register SR2 produces an output having a phase advanced only by half cycle of $f_s$ relative to the phase of an output on a terminal $Q_2$. Frequency divider circuit 16 includes shift registers SR1-SR4, a JKFF (JK flip-flop) 24, AND gates 30, 31, NOR gates 32–36, and inverters 37, 38.

The second phase comparison circuit 21 includes an AND gate 39, OR gates 40, 41, 42, NAND gates 43, 44, 45, NOR gates 46, 47, inverters 48, 49, and shift registers 25, 26. NAND gates 43 and 44 form a set-reset flip-flop RSFF$_1$ and NOR gates 46, and 47 a set-reset flip-flop RSFF$_2$. To the OR gate 40 are supplied the output signal $\overline{f_a'+}$ of the phase advancing circuit 22, first clock signal $f_a'$ and an inverted signal $\overline{f_a}$ of second clock signal $f_a$. To the AND gate 39 are supplied an inverted signal $\overline{f_a}$ of second clock signal $f_a$, the first clock signal $f_a'$ and output signal $\overline{f_a'-}$ of phase lagging circuit 23. A divided output $f_A$ is obtained through the NOR gate 34 in the first frequency divider circuit 16. Relative connections among the AND gates, OR gates, NAND gates, NOR gates and inverters and those among shift registers SR1–Sr4, 25, 26, and JKFF 24 are as shown in FIG. 2 and description about these connections is therefore omitted.

Figure 4A:
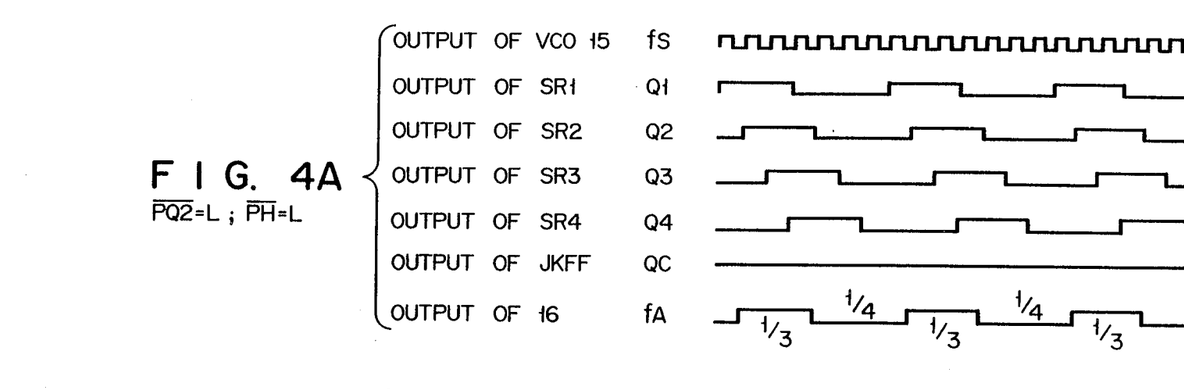
FIG. 4A shows signal waveforms in the first frequency divider shown in FIG. 2 during the first frequency dividing mode of the first frequency divider circuit shown in FIG. 1.
Figure 4B:
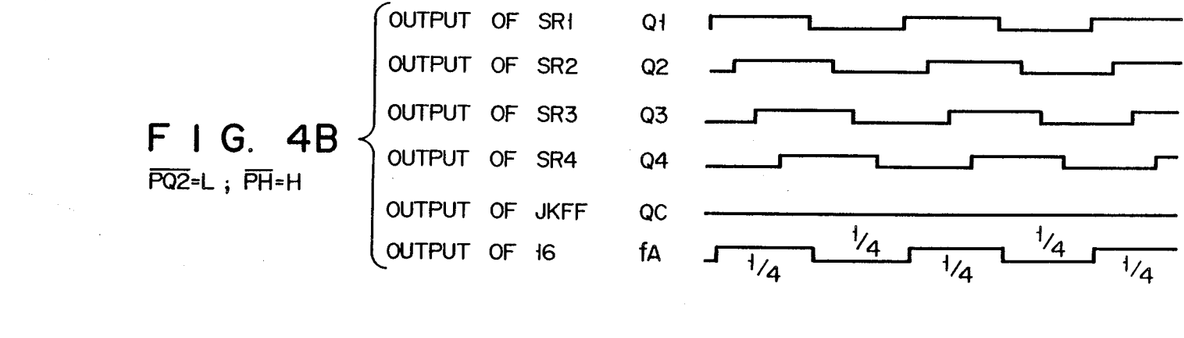
FIG. 4B shows signal waveforms in the first frequency divider shown in FIG. 2 during the second frequency dividing mode.
Figure 4C:
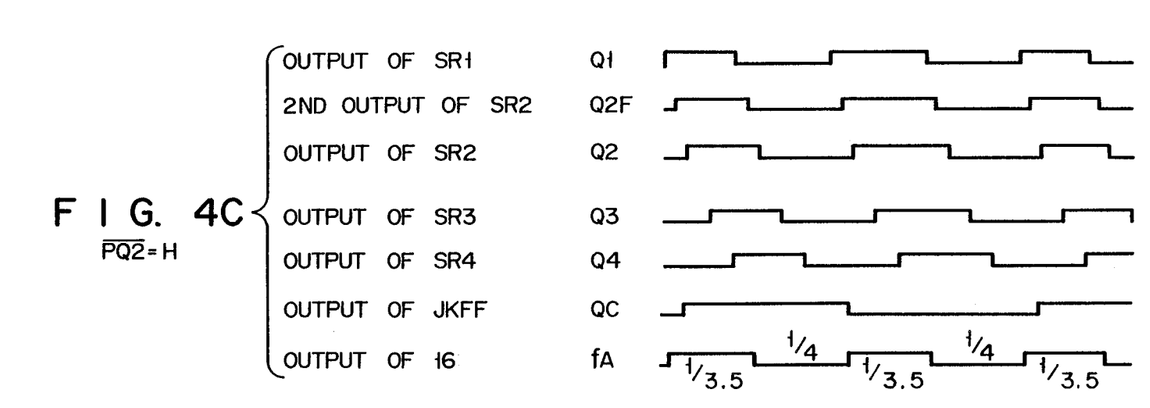
FIG. 4C shows signal waveforms in the first frequency divider shown in FIG. 2 during the third frequency dividing mode.
Figure 5:
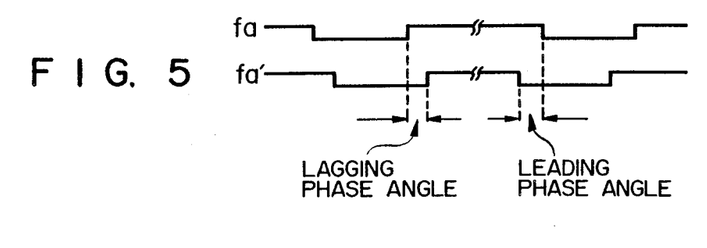
FIG. 5 is a chart for illustrating the phase difference between first and second clock signals shown in FIG. 1.

Operation of first frequency divider circuit 16 shown in FIG. 2 will be now described referring to FIGS. 4A–4C. It is assumed that the oscillation signal $f_s$ of VCO 15 shown in FIG. 1 has such a frequency as shown in FIG. 4A. It is also assumed that signals $\overline{PH}$ (output of RSFF$_1$) and $\overline{PQ_2}$ (output of inverter 49) for controlling the frequency dividing ratio of first divider circuit 16 both have an "L" level.

The $\overline{J}$ input terminal of JKFF 24 becomes "L" level and the $\overline{K}$ input terminal becomes "H" level. A first output terminal QC of JKFF 24 then becomes "H" level as shown in FIG. 4A. Therefore, a second output terminal $\overline{QC}$ of JKFF 24 becomes "L" level. Levels of output voltages appearing at output terminals $Q_1$–$Q_4$ of shift registers SR1-Sr4 change as shown in FIG. 4A, respectively. Every time when an output terminal $Q_4$ of shift register SR4 becomes "H" level, a clear signal is applied to a clear terminal CL of shift register SR1 through the inverter 38 and NOR gate 36. Therefore, the output signal $f_A$ of first frequency divider circuit 16 becomes a signal having a frequency in which the oscillation signal $f_s$ is divided to 1/7. Numerals ⅓ and ¼ annexed to the signal waveform $f_A$ represent frequency dividing ratios, that is, time periods which are three and four times the cycle of signal $f_s$, respectively.

If the signal $\overline{PQ_2}$ (output of inverter 49) is of "L" level and the signal $\overline{PH}$ (output of RSFF$_1$) is of "H" level, then, as shown in FIG. 4B the $\overline{J}$ terminal of JKFF 24 becomes "H" level and the $\overline{K}$ terminal "L" level, so that the first output terminal QC of JKFF 24 becomes "L" level and the second output terminal $\overline{QC}$ thereof "H" level. Therefore, no clear signal is applied to the CL terminal (or clear terminal) of shift register SR1. The output signal of first frequency divider circuit 16 therefore becomes a signal having a frequency in which the oscillation signal $f_s$ is divided to ⅛.

If the signal $\overline{PQ_2}$ (output of inverter 49) becomes "H" level, then, as shown in FIG. 4C, the signal $\overline{PH}$ (output of RSFF$_1$) may be either of "H" level or of "L" level. This time, $\overline{J}$ and $\overline{K}$ input terminals of JKFF 24 become "L" level, so that the JKFF 24 divides the output $Q_2$ to ½ at the time when it rises at the output terminal $Q_2$ of shift register SR2. As described referring to FIG. 4A, the first frequency divider circuit 16 divides the signal $f_s$ to 1/7 when the first output terminal QC of JKFF 24 is of "H" level and to ⅛ when the first output terminal QC is of "L" level, as described referring to FIG. 4B. Therefore, what signal at the output terminal $Q_2$ of shift register SR2 is divided to ½ as shown in FIG. 4C means that the output signal $f_A$ of first frequency divider circuit 16 becomes a signal having a frequency in which the output signal of VCO 15 is divided to 1/7.5. As described referring to FIGS. 4A–4C, the frequency dividing ratio of first divider circuit 16 is controlled according to levels of signals $\overline{PQ_2}$ and $\overline{PH}$ which is apparent from the following table.

TABLE

| Level of $\overline{PQ_2}$ (Inverter 49) | Level of $\overline{PH}$ (RSFF$_1$) | Output QC of JKFF 24 | Dividing ratio of divider 16 |
|---|---|---|---|
| H | H or L | $Q_2$ of SR2 is divided to ½ | 1/7.5 |

TABLE-continued

| Level of $\overline{PQ_2}$ (Inverter 49) | Level of $\overline{PH}$ (RSFF$_1$) | Output QC of JKFF 24 | Dividing ratio of divider 16 |
|---|---|---|---|
| L | H | L | ⅛ |
| L | L | H | 1/7 |

As described above, rising phases of first and second clock signals $f_a'$ and $f_a$ are detected and the frequency dividing ratio of first frequency divider circuit 16 is controlled according to the phase difference between these clock signals so as to synchronize phases of signals $f_a$ and $f_a'$ immediately. Namely, providing that the frequency dividing ratio of first frequency divider circuit 16 is usually 1/N, the frequency dividing ratio is controlled in such a way that N becomes N, N+1, or [N+(N+1)/2]=N+0.5, where N represents a positive integer.

As soon as a phase difference is caused between first and second clock signals $f_a'$ and $f_a$, the phases of both signals can be immediately synchronized with each other by controlling the frequency dividing ratio of first frequency divider circuit 16 to one of these three modes. To be more concrete, in the case where the phase of first clock signal $f_a'$ is lagged relative to that of second clock signal $f_a$, the frequency dividing ratio of first frequency divider circuit 16 is controlled to 1/7 during one cycle of first clock signal $f_a'$ and then to 1/7.5 during the remaining period of one cycle. In the case where the phase of first clock signal $f_a'$ is advanced relative to that of second clock signal $f_a$, the frequency dividing ratio of first divider circuit 16 is controlled to ⅛ only one time and then to 1/7.5 during the remaining period of one cycle.

Figure 6A:
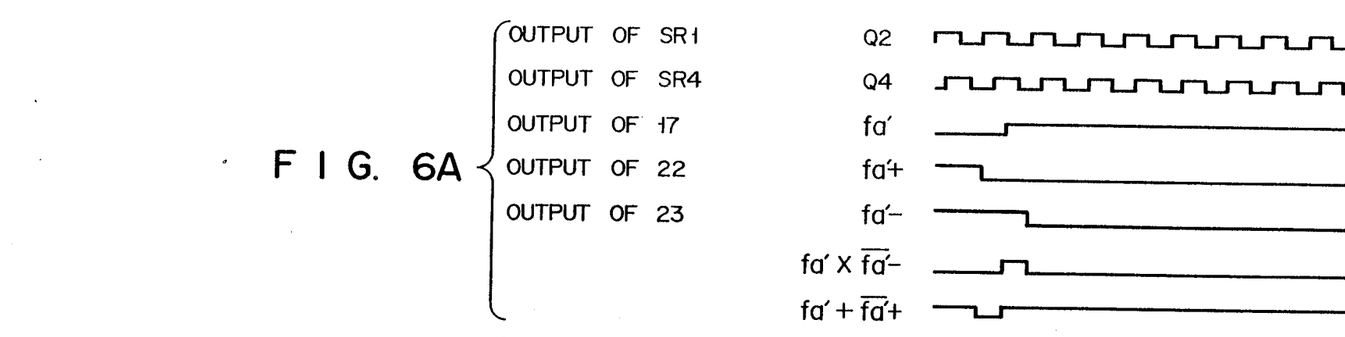
FIG. 6A-6C are timing charts to explain the operation of circuit shown in FIG. 2.
Figure 6B:
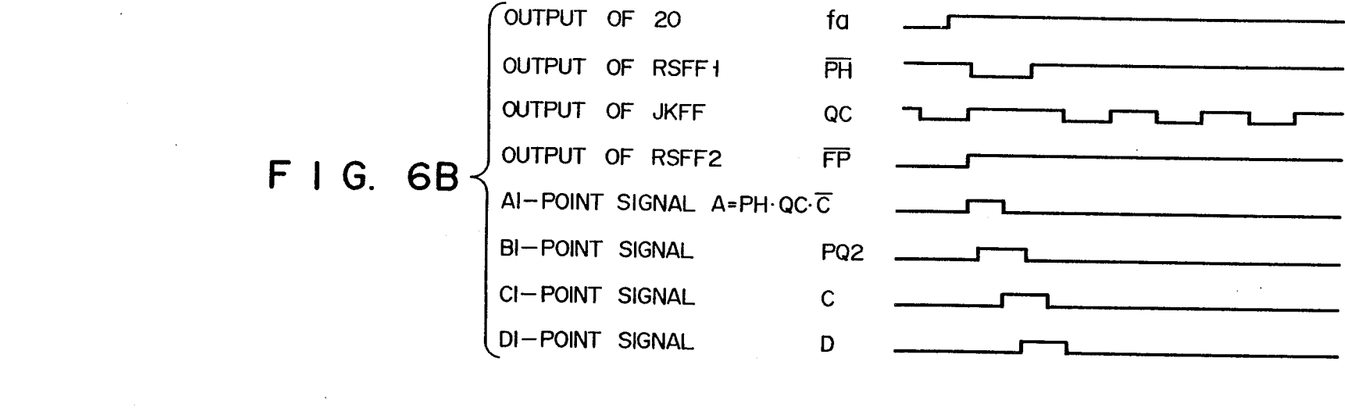
Figure 6C:
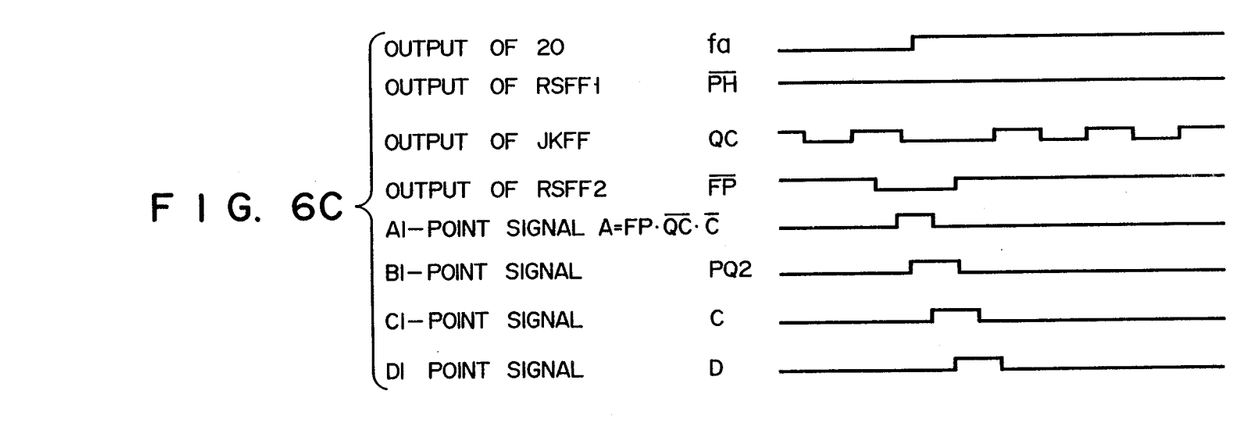

Before the operation of second phase comparison circuit 21 shown in FIG. 2 is described, the phase advancing circuit 22 and phase lagging circuit 23 will be described. As shown in FIG. 6A, the phase advancing circuit 22 is intended to produce the signal $\overline{f_a'+}$ which corresponds to the output signal of second divider circuit 17 or first clock signal $f_a'$ which has been advanced in phase by a half cycle of the output pulse from the output terminal Q$_2$ of shift register SR2. As shown in FIG. 6A, the phase lagging circuit 23 is intended to produce the signal $\overline{f_a'-}$ corresponding to the first clock signal $f_a'$ which lags in phase by a half cycle of output pulse from the output terminal Q$_2$. These signals $\overline{f_a'+}$ and $\overline{f_a'-}$ are used in the second phase comparison circuit 21 to produce pulses of narrow width before and after the first clock signal $f_a'$ rises. Namely, signals $f_a'$ and $\overline{f_a}$ are used to obtain the output of AND gate 39, which receives, as inputs, $f_a'$, $\overline{f_a'-}$ and $\overline{f_a}$ (inverted signal of $f_a$). The signals fa' and fa are also used to obtain the output of OR gate 40, which receives, as inputs, $\overline{f_a'+}$, $f_a'$ and $\overline{f_a}$. Where $f_a'$ is lagged relative to $f_a$, the output $\overline{PH}$ of RSFF$_1$ becomes "L" level, as shown in FIG. 6B, due to the output of OR gate 40 which corresponds to the logical sum of signals $\overline{f_{a+}}$, $f_a'$ and $\overline{f_a}$, and the output $\overline{FP}$ of RSFF$_2$ becomes "H" level at the same time.

To make the description simpler the output line of NAND gate 45 is represented by A1, Q output terminal of shift register 25 B1, Q output line of shift register 26 D1, and QF output line of shift register 26 C1, and that signals at output lines A1, B1, C1 and D1 are represented by A, $\overline{A}$ B, $\overline{B}$ C, $\overline{C}$ and D, $\overline{D}$ respectively. In the case where the second clock signal $f_a$ is advanced relative to the first clock signal $f_a'$ (see FIG. 6B), the output of OR gate 40 becomes $f_a'+\overline{f_a'+}$ causing the output $\overline{PH}$ of RSFF$_1$ to be made of "L" level. When the $\overline{QC}$ output of JKFF 24 becomes "L", the level at point A1 becomes "H" and the level at line B1 "h", thus causing the RSFF$_1$ to be reset. The first frequency divider circuit 16 divides the output signal $f_s$ of VCO 15 to 1/7 during the period when the line B1 is "H", PQ$_2$="L" and PH="L". As the result, first and second clock signals $f_a'$ and $f_a$ can be synchronized in phase.

Let us consider now the case where the phase of first clock signal $f_a'$ is advanced relative to that of second clock signal $f_a$. The RSFF$_2$ is set by applying to the NOR gate 47 of RSFF$_2$ the output of AND gate 39 which serves to obtain the logical product of signals $f_a'$, $\overline{f_a'-}$ and $\overline{f_a}$, and the output $\overline{FP}$ of this RSFF$_2$ becomes "L" level. Therefore, the output $\overline{PQ_2}$ of inverter 49 becomes "L" level and the output $\overline{PH}$ of RSFF$_1$ "H" level. As apparent from the above-mentioned table, the first frequency divider circuit can be operated so as to divide the frequency of the output signal $f_s$ of VCO 15 to ⅛. As the result, first and second clock signals $f_a'$ and $f_a$ can be synchronized in phase.

According to the embodiment of the present invention as described above, pulses of narrow width are generated through the OR gate 40 and AND gate 39 before and after the first clock signal $f_a'$ rises, and the time when the second clock signal $f_a$ rises is detected by these pulses of narrow width. Even if noise is added to the second clock signal $f_a$ because of wiring arrangement, no influence is given to the synchronizing operation of first and second clock signals as long as noise is not added to the second clock signal $f_a$ during the period when pulses of narrow width are generated.

The embodiment of the present invention shown in FIG. 1 is intended to separate vertical synchronizing signal from video signal, for example, by means of synchronizing signal separation circuit 12, and second, third and fifth frequency divider circuits 17, 18 and 20 are therefore arranged in addition to first and fourth divider circuits 16 and 19. However, second, third and fifth divider circuits may be omitted depending upon the frequency of input signal of first phase comparison circuit. In this case, the first frequency divider circuit 16 can be used as first frequency dividing means, and the fourth frequency divider circuit as second frequency dividing means. Therefore, the output of first frequency divider circuit 16 can be used as first clock signal and the output of fourth frequency divider circuit 19 as second clock signal.

It should be understood that the present invention is not limited to the embodiment as described above. It is not necessary to limit first and second clock signals f' and $f_a$ applicable only to reproducing and recording sections as in the case where digital data are reproduced and reproduced data are recorded on a new recording medium.

What we claim is:

1. A phase synchronizing circuit coupled to a predetermined input signal and including a phase locked loop, said circuit comprising:
   a first phase comparison circuit having two inputs one of which is said predetermined input signal,
   a voltage controlled oscillator (VCO) coupled to said first phase comparison circuit for producing an oscillating output the frequency of which is controlled by the output of said first phase comparison circuit, first frequency dividing means having a first frequency divider to divide the output frequency of said VCO and having as outputs a first clock signal and a synchronizing signal derived from said first clock signal, said synchronizing signal serving as the other input to said first phase comparison circuit, second frequency dividing means for dividing the output frequency of said VCO to obtain a second clock signal, and a second phase comparison circuit receiving, as inputs, said first clock signal from said first frequency dividing means and said second clock signal from said second frequency dividing means to compare phases of said first and second clock signals, said second phase comparison circuit further including frequency dividing ratio controlling means for controlling said first frequency divider and said second phase comparison circuit such that the frequency dividing ratio of said first divider is changed to one of three ratios of $1/N$, $1/(N+1)$ and $1/\{(N+(N+1))/2\}$, where N is a positive integer, according to the phase difference between said first and second clock signals so as to synchronize the phases of said first and second clock signals with said input signal.

2. A phase synchonizing circuit according to claim 1 wherein said frequency dividing ratio controlling means includes a phase advancing circuit for generating a phase advancing signal which leads said first clock signal by a predetermined angle; and a phase-lagging circuit for generating a phase-lagging signal which lags said first clock signal by the predetermined angle, and wherein said phase-advancing and phase-lagging signals are supplied to said second phase comparison circuit as signals for detecting the leading edge of said second clock signal.

* * * * *